(12) United States Patent
Akama et al.

(10) Patent No.: US 9,800,237 B2
(45) Date of Patent: Oct. 24, 2017

(54) DRIVE DEVICE

(71) Applicant: DENSO CORPORATION, Kariya, Aichi-pref. (JP)

(72) Inventors: Sadahiro Akama, Kariya (JP); Kiyoshi Yamamoto, Kariya (JP); Atsushi Kobayashi, Kariya (JP); Atsushi Kanamori, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/117,512

(22) PCT Filed: Mar. 12, 2015

(86) PCT No.: PCT/JP2015/001363
§ 371 (c)(1),
(2) Date: Aug. 9, 2016

(87) PCT Pub. No.: WO2015/146038
PCT Pub. Date: Oct. 1, 2015

(65) Prior Publication Data
US 2016/0352316 A1 Dec. 1, 2016

(30) Foreign Application Priority Data

Mar. 27, 2014 (JP) .................. 2014-066595
Oct. 28, 2014 (JP) .................. 2014-219348

(51) Int. Cl.
*G05F 1/565* (2006.01)
*H03K 17/567* (2006.01)
(Continued)

(52) U.S. Cl.
CPC ......... *H03K 17/0406* (2013.01); *G05F 1/565* (2013.01); *H03K 17/167* (2013.01); *H03K 17/567* (2013.01); *H03K 17/6871* (2013.01)

(58) Field of Classification Search
CPC ....... G05F 1/00; G05F 1/565; H03K 17/0406; H03K 17/04126; H03K 17/063; (Continued)

(56) References Cited

U.S. PATENT DOCUMENTS 5,293,077 A 3/1994 Seki et al.
6,215,634 B1 4/2001 Terasawa
(Continued)

FOREIGN PATENT DOCUMENTS

JP  2006-339530 A  12/2006
JP  3885563 B2  2/2007
(Continued)

*Primary Examiner* — Lincoln Donovan
*Assistant Examiner* — David Mattison
(74) *Attorney, Agent, or Firm* — Posz Law Group, PLC

(57) ABSTRACT

A drive device for controlling a power switching element includes: an on-side circuit that performs an on operation of the power switching element; and an off-side circuit that performs an off operation of the power switching element. The on-side circuit or the off-side circuit includes: multiple main MOS transistors; a sense MOS transistor that define a drain current of each main MOS transistor; and a sense current control circuit that controls a drain current of the sense MOS transistor to be constant; and a switch circuit that is connected to the gate of each main MOS transistor, and controls each main MOS transistor to turn on and off so as to switch a gate current in the power switching element.

11 Claims, 9 Drawing Sheets

(51) Int. Cl.
*H03K 17/04* (2006.01)
*H03K 17/16* (2006.01)
*H03K 17/687* (2006.01)

(58) Field of Classification Search
CPC .. H03K 17/0826; H03K 17/00; H03K 17/167; H03K 17/567; H03K 17/601; H03K 17/6871; H03K 2217/00; H03K 2217/0036
USPC .......................................................... 327/109
See application file for complete search history.

(56) References Cited

U.S. PATENT DOCUMENTS

| | | |
|---|---|---|
| 2006/0001481 A1 | 1/2006 | Koizumi et al. |
| 2008/0012630 A1 | 1/2008 | Koizumi et al. |
| 2009/0167272 A1* | 7/2009 | Furuichi ............ H03K 17/0822 323/284 |
| 2010/0164771 A1 | 7/2010 | Mateman |
| 2010/0213989 A1 | 8/2010 | Nakatake et al. |
| 2012/0112783 A1 | 5/2012 | Ishida et al. |
| 2012/0299624 A1* | 11/2012 | Sugahara ............ H03K 17/168 327/109 |
| 2013/0169322 A1* | 7/2013 | Shen ........................ H03K 3/78 327/109 |
| 2015/0035569 A1* | 2/2015 | Miura ................... H03K 17/167 327/109 |

FOREIGN PATENT DOCUMENTS

| | | |
|---|---|---|
| JP | 2010-283973 A | 12/2010 |
| JP | 2014-54019 A | 3/2014 |
| WO | 2015/155962 A1 | 10/2015 |
| WO | 2015/170439 A1 | 11/2015 |

* cited by examiner

DRIVE DEVICE

CROSS REFERENCE TO RELATED APPLICATIONS

This application is a U.S. national stage of International Application No. PCT/JP2015/001363 filed on Mar. 12, 2015 and is based on Japanese Patent Application No. 2014-66595 filed on Mar. 27, 2014, and No. 2014-219348 filed on Oct. 28, 2014, the disclosures of which are incorporated herein by reference.

TECHNICAL FIELD

The present disclosure relates to a drive device that performs an on/off operation of a power switching element.

BACKGROUND ART

Active gate control (AGC) which actively controls a gate voltage or a gate current is used as a technique for eliminating a trade-off between a surge voltage and a switching loss during a switching operation in a power switching element that constitutes a semiconductor power conversion device such as an inverter or a converter.

For example, when an insulated gate bipolar transistor (IGBT) is used as a power switching element, a change with time dV/dt of a collector-emitter voltage (hereinbelow, referred to as a collector voltage Vce) during turning-off is fed back to control a discharging speed of a gate charge of the IGBT. Specifically, Patent Literature 1 proposes a technique for switching the discharging speed of the gate charge in the middle of discharge by switching the amount of a gate current injected to the gate of the IGBT. However, the technique of Patent Literature 1 requires gate-off circuits corresponding to the number of switching stages. Thus, a circuit scale, that is, the layout area becomes large.

On the other hand, Patent Literature 2 proposes a circuit that enables the layout area to be reduced in a semiconductor device that has a wide output current, that is, capable of widely switching an output current. Specifically, the semiconductor device generates the output current by a current mirror of a reference current. Further, a wide dynamic range of the output current is achieved by a multistage current mirror.

However, the technique of Patent Literature 2 performs current supply to the gate for turning on an output transistor with the reference current. Thus, as the number of stages of output transistors that constitute the current mirror increases, the reference current varies. That is, every time the output transistor is turned on, the output current varies.

Further, in the circuit configuration as employed in Patent Literature 2, it is commonly desired to make the reference current as small as possible. However, a charge injection speed to the gate of the output transistor constituting the current mirror depends on the reference current. Thus, when the reference current is small, a time required to turn on the output transistor increases. That is, when the technique of Patent Literature 2 is applied to an off circuit of a power switching element, it may not be possible to ensure a response speed from when an instruction of turning off the power switching element is received until when an output transistor is turned on.

PRIOR ART LITERATURES

Patent Literature

Patent Literature 1: JP-3885563-B1
Patent Literature 2: JP-2006-20098-A

SUMMARY OF INVENTION

In view of the above difficulties, it is an object of the present disclosure to increase the switching speed of the gate current while controlling the gate current with high accuracy.

According to an aspect of the present disclosure, a drive device for controlling a power switching element to turn on and off includes: an on-side circuit that performs an on operation of the power switching element; and an off-side circuit that performs an off operation of the power switching element. At least one of the on-side circuit and the off-side circuit includes: a plurality of main MOS transistors that provide output transistors; a sense MOS transistor that includes a gate in common with the main MOS transistors, constitutes a current mirror with respect to the main MOS transistors to define a drain current of each main MOS transistor; and a sense current control circuit that controls a drain current of the sense MOS transistor to be constant. The at least one of the on-side circuit and the off-side circuit further includes a switch circuit that is connected to the gate of each of the main MOS transistors, and controls each of the main MOS transistors to turn on and off so as to switch a gate current in the power switching element.

According to this configuration, the plurality of main MOS transistors which constitute the current mirror with the sense MOS transistor are formed, and enabling/disabling thereof is controlled by on/off control of the switch circuit. Thus, it is possible to switch the output current by switching the number of main MOS transistors to be enabled.

Further, the drain current of the sense MOS transistor that defines the drain current of the main MOS transistor by the current mirror is defined by the reference potential and the resistance value of the reference resistor. Thus, the output current can be controlled with high accuracy regardless of the power supply voltage that supplies power to the drive device according to the present disclosure and the current value of the output current of the off-side circuit. Further, the drain current of the sense MOS transistor is constant regardless of an on/off state of the switch circuit. Thus, the output current can be controlled with high accuracy regardless of the number of main MOS transistors to be enabled.

The voltage application to the gate for driving the main MOS transistor as an output transistor is controlled by the output of the operational amplifier. Thus, it is possible to increase the switching speed compared to a case in which the control is performed with the reference current.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION (First Embodiment)

First, a drive device according to a first embodiment will be described with reference to FIG. 1.

Figure 1:
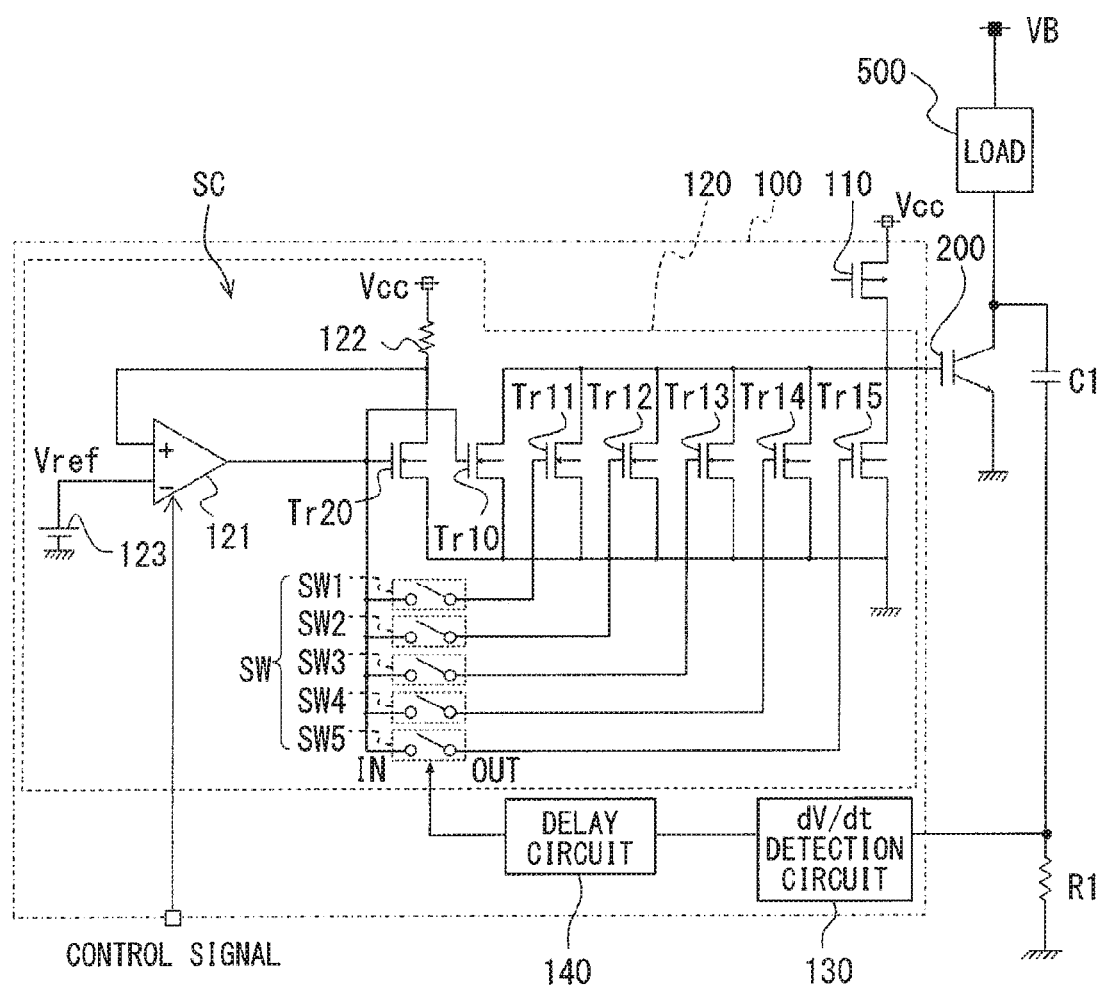
FIG. 1 is a circuit diagram illustrating a schematic configuration of a drive device according to a first embodiment.

As illustrated in FIG. 1, the drive device 100 controls the drive of an insulated gate bipolar transistor (IGBT) 200 as a power switching element which drives a load 500.

The drive device 100 includes an on-side circuit 110, an off-side circuit 120, a dV/dt detection circuit 130, and a delay circuit 140.

The on-side circuit 110 and the off-side circuit 120 are connected in series between a power supply and the GND. A gate of the IGBT 200 is connected to an intermediate point between the on-side circuit 110 and the off-side circuit 120. The on-side circuit 110 includes a PMOS transistor. When the PMOS transistor is in an on state, a power supply voltage Vcc is applied to the gate of the IGBT 200, Accordingly, the IGBT 200 is turned on, and a current flows between a collector and an emitter of the IGBT 200, so that power is supplied to the load 500.

The off-side circuit 120 includes a plurality of NMOS transistors (Tr10 to Tr15, Tr20). These NMOS transistors include main MOS transistors (Tr10 to Tr15) as output transistors and a sense MOS transistor Tr20 which defines drain currents of the main MOS transistors. In the present embodiment, the six main MOS transistors (Tr10 to Tr15) constitute a current mirror with respect to the sense MOS transistor Tr20. Specifically, a gate of each of the main MOS transistors (Tr10 to Tr15) is common with a gate of the sense MOS transistor Tr20, and sources thereof are connected in common to the GND. A drain of each of the main MOS transistors (Tr10 to Tr15) is connected to the gate of the IGBT 200.

In such a configuration, a drain current flows through each of the main MOS transistor (Tr10 to Tr15) with a current ratio that is equal to a size ratio of the sense MOS transistor Tr20. That is, in the present embodiment, there are six current paths for a current injected to the gate of the IGBT 200. The size described herein is an aspect ratio (W/L) between a channel width W and a channel length L in the MOS transistor.

The off-side circuit 120 includes an operational amplifier 121 for controlling a drain current of the sense MOS transistor Tr20, a reference resistor 122 for defining an output of the operational amplifier 121, and a reference power supply 123 which applies a reference potential Vref to one input terminal of the operational amplifier 121. When a control signal indicating turning-off of the IGBT 200 is input to the operational amplifier 121 from a microcomputer (not illustrated), the operational amplifier 121 applies a voltage to the gate of the sense MOS transistor Tr20 so as to inject a constant current to the gate of the IGBT 200.

The reference resistor 122 is a shunt resistor and defines a current value of the drain current of the sense MOS transistor Tr20. Further, the reference resistor 122 defines a current value of the current injected to the gate of the IGBT 200. The current injected to the gate of the IGBT 200 is the sum of drain currents flowing through the main MOS transistors (Tr10 to Tr15). The main MOS transistors (Tr10 to Tr15) constitute the current mirror together with the sense MOS transistor Tr20. Thus, the current injected to the gate of the IGBT 200 depends on the drain current of the sense MOS transistor Tr20.

In such a configuration, when a signal indicating turning-off of the IGBT 200 is input, the operational amplifier 121 is driven to apply a gate voltage to the sense MOS transistor Tr20. A drain current at this time is defined by a resistance value R of the reference resistor 122. The current value is feedback-controlled by adjusting the output of the operational amplifier 121 so that an intermediate potential between the reference resistor 122 and the sense MOS transistor Tr20 approaches the reference potential Vref. Accordingly, the drain current of the sense MOS transistor Tr20 is controlled at a constant value (=(Vcc−Vref)/R) with high accuracy. Thus, the current injected to the gate of the IGBT 200 is also maintained at a constant current with high accuracy. In the present embodiment, a sense current control circuit SC corresponds to a circuit that includes the operational amplifier 121, the reference resistor 122, and the reference power supply 123.

The off-side circuit 120 further includes switch circuits (SW1 to SW5) for switching a current value of the current injected to the gate of the IGBT 200, that is, for switching a drive capacity. The switch circuits (SW1 to SW5) are respectively connected to the gates of the five main MOS transistors (Tr11 to Tr15) in the six main MOS transistors (Tr10 to Tr15). For example, when the switch circuit SW1 is enabled and the other switch circuits (SW2 to SW5) are disabled, a gate charge of the IGBT 200 is drawn by a current defined by the main MOS transistors Tr10 and Tr11. That is, it is possible to control the drive capacity of the off-side circuit 120 depending on which one of the switch circuits (SW1 to SW5) is enabled. The five switch circuits (SW1 to SW5) are equivalent to each other. Thus, hereinbelow, the switch circuits are collectively designated by a reference sign SW except when each of the switch circuits is individually described. A detailed circuit configuration of the switch circuit SW in the present embodiment will be described below.

The dV/dt detection circuit 130 in the drive device 100 detects a change with time dV/dt of a collector voltage Vce of the IGBT 200. Specifically, the dV/dt detection circuit 130 is connected to an intermediate point between a capacitor C1 and a resistor R1 which are connected in series between the collector of the IGBT 200 and the GND to constitute a differentiator. When a signal indicating turning-off of the IGBT 200 is input to the operational amplifier 121, the gate charge of the IGBT 200 is drawn to increase the collector voltage Vce. Thus, dV/dt has a value other than zero. The dV/dt detection circuit 130 detects this state, and outputs the detected result to the delay circuit 140.

The delay circuit 140 operates the switch circuit SW with a delay by a predetermined delay time from a point when dV/dt starts rising. It may be previously determined or determined according to a value of dV/dt which one of the five switch circuits (SW1 to SW5) is to be operated.

Figure 2:
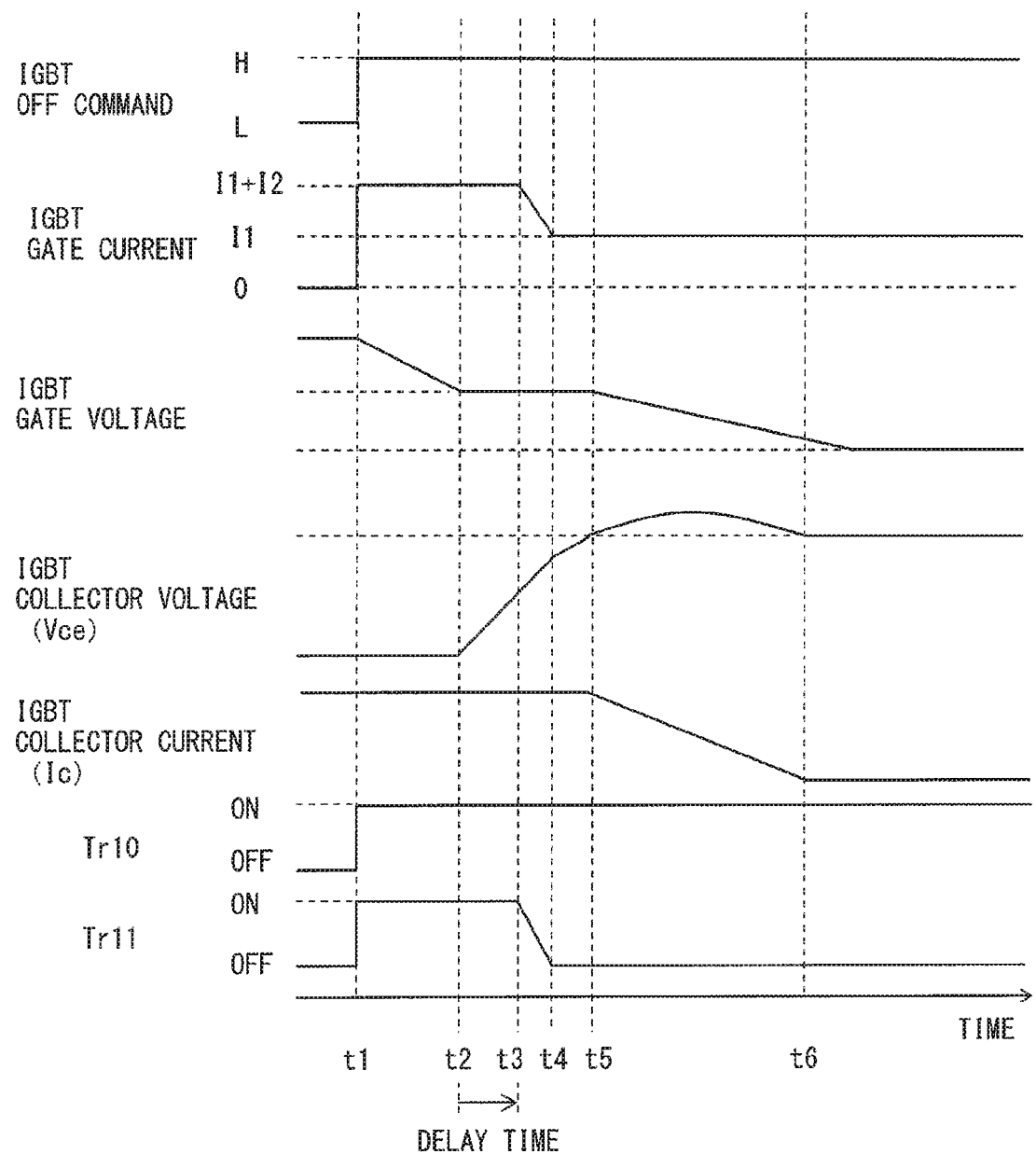
FIG. 2 is a timing chart illustrating driving by the drive device.

Next, driving for switching a charge discharging speed during a discharge period of the gate charge of the IGBl 200 as performed in the drive device 100 of the present embodiment will be described with reference to FIG. 2.

At a time t1, a control signal indicating turning-off of the IGBT 200 is input to the operational amplifier 121. Accordingly, as illustrated in FIG. 2, the operational amplifier 121 is driven to inject a current to the gate of the IGBT 200. In this description, in the switch circuits SW at the time t1, the switch circuit SW1 is enabled (on) and the switch circuits SW2 to SW5 are disabled (off). That is, the current injected to the gate has a total value I1+I2 of a drain current I1 of the main MOS transistor Tr10 and a drain current I2 of the main MOS transistor T11.

When the current is injected to the gate of the IGBT 200 to start the charge drawing, the gate voltage decreases. Then, at a time t2, after the elapse of a predetermined time from when the gate voltage decreases up to a predetermined potential (mirror voltage), the collector voltage Vce starts rising. That is, at the point of time t2, dV/dt is increased to a positive value from approximately zero. The dV/dt detection circuit 130 detects this state, and outputs the detected result to the delay circuit 140.

Then, at a time t3 after the delay time previously defined by the delay circuit 140, the switch circuit SW1 is turned off to start an off operation of the main MOS transistor Tr11. The main MOS transistor Tr11 is not instantaneously turned off, but brought into an off state after a falling time defined by the element (time t4). Thus, the current injected to the gate changes from I1+I2 to I1 during a period between the time t3 and the time t4. During this period, the change dV/dt of the collector voltage Vce of the IGBT 200 is gradually reduced. At the time t4, the main MOS transistor Tr11 comes to an off state, and the gate current of the IGBT 200 is switched from I1+I2 to I1.

Thus, the drive capacity of the off-side circuit 120, that is, the discharging speed of the gate charge at time t4 is smaller than that at the time t3. Thus, dV/dt immediately after the time t4 is smaller than dV/dt immediately before the time t3. As a result, the overshoot of the collector voltage Vce is reduced, and an effect of reducing a surge voltage can be exhibited. Then, at a time t6, the collector voltage Vce converges to a steady-state value, and the off operation of the IGBT 200 is finished.

The timing (time t3) of starting the turning-off of the main MOS transistor Tr11 is preferably set so that the time t4 when the main MOS transistor Tr11 is completely turned off comes earlier than the time t5 when the collector voltage Vce reaches an assumable steady-state value.

Further, the main MOS transistor Tr11 may be again turned on after the time t6 to improve the drive capacity of the off-side circuit 120 to ensure reliable turning-off of the IGBT 200.

Figure 3:
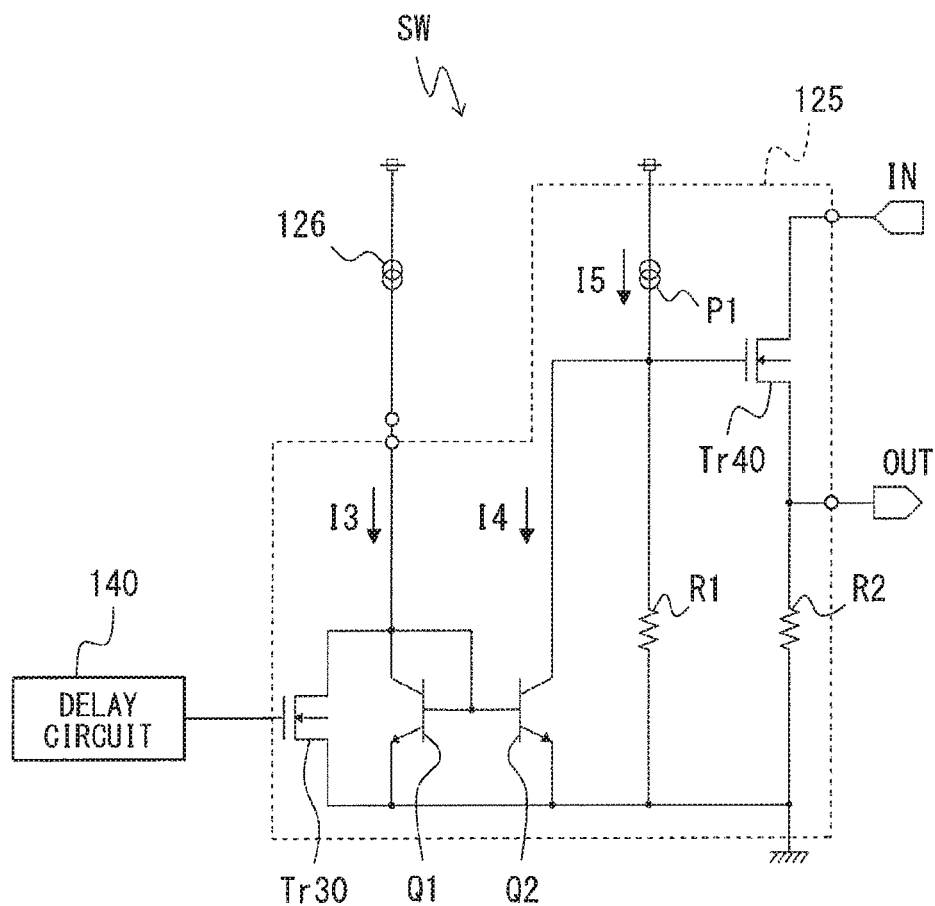
FIG. 3 is a circuit diagram illustrating a detailed configuration of a switch circuit.

Next, a specific configuration of the switch circuit SW in the present embodiment will be described with reference to FIG. 3. All the switch circuits (SW1 to SW5) have the same configuration as illustrated in FIG. 3.

The switch circuit SW includes a main circuit 125 and a constant-current circuit 126 which supplies a constant current I3 to the main circuit 125.

The main circuit 125 performs the passage and interruption of a current between an input terminal IN and an output terminal OUT in accordance with a signal from the delay circuit 140. As illustrated in FIG. 3, the main circuit 125 includes a MOS transistor Tr30 which performs an on/off operation in response to a signal from the delay circuit 140. The main circuit 125 further includes two NPN transistors Q1, Q2 which are connected to the constant-current circuit 126 in parallel to the MOS transistor Tr30 and constitute a current mirror so as to mirror the current I3 input from the constant-current circuit 126. The main circuit 125 further includes a MOS transistor Tr40 which performs the passage and interruption of a current between the input terminal IN and the output terminal OUT in accordance with a current injected to the gate. The main circuit 125 further includes a current source P1 which injects a current to the gate of the MOS transistor Tr40 to turn on the switch circuit SW. In the present embodiment, the input terminal IN illustrated in FIG. 3 is connected to an output terminal of the operational amplifier 121, and the output terminal OUT is connected to the gate of the main MOS transistor (Tr11 to Tr15).

An operation of the main circuit 125 will be described. When the switch circuit SW is turned on, a signal indicating turning-on of the MOS transistor Tr30 is input from the delay circuit. In this state, the current I3 from the constant-current circuit 126 flows as a drain current of the MOS transistor Tr30, and no current flows through the NPN transistors Q1, Q2 which constitute the current mirror. That is, a current I4 illustrated in FIG. 3 does now flow. Thus, a current I5 from the current source P1 is injected to the gate of the MOS transistor Tr40 to turn on the MOS transistor Tr40, so that a current is caused to pass between the input terminal IN and the output terminal OUT That is, the switch circuit SW is turned on. The resistor R1 inserted between the current source P1 and the GND is a resistor for defining a gate voltage of the MOS transistor Tr40 in a steady state.

On the other hand, when the switch circuit SW is turned off, a signal indicating turning-off of the MOS transistor Tr30 is input from the delay circuit. In this state, the drain current of the MOS transistor Tr30 does not flow, and the current I3 input to the main circuit 125 from the constant-current circuit 126 is mirrored by the NPN transistors Q1, Q2, so that the current I4 illustrated in FIG. 3 flows. The current I4 flows so as to draw the current I5 injected by the current source P1 and the gate charge of the MOS transistor Tr40. Thus, the MOS transistor Tr40 is turned off. Accordingly, the current between the input terminal IN and the output terminal OUT is interrupted to turn off the switch circuit SW. When the switch circuit SW is turned off, the gate of the corresponding MOS transistor presents a high impedance. The switch circuit SW in the present embodiment includes a pull-down resistor R2 which is inserted between the output terminal OUT and the GND to ensure a reliable off operation of the switch circuit SW.

The constant-current circuit 126 is a circuit for supplying the constant current I3 to the main circuit 125. A common circuit for applying a constant current can be employed as the constant-current circuit 126. Thus, detailed description for the circuit will be omitted.

Figure 4:
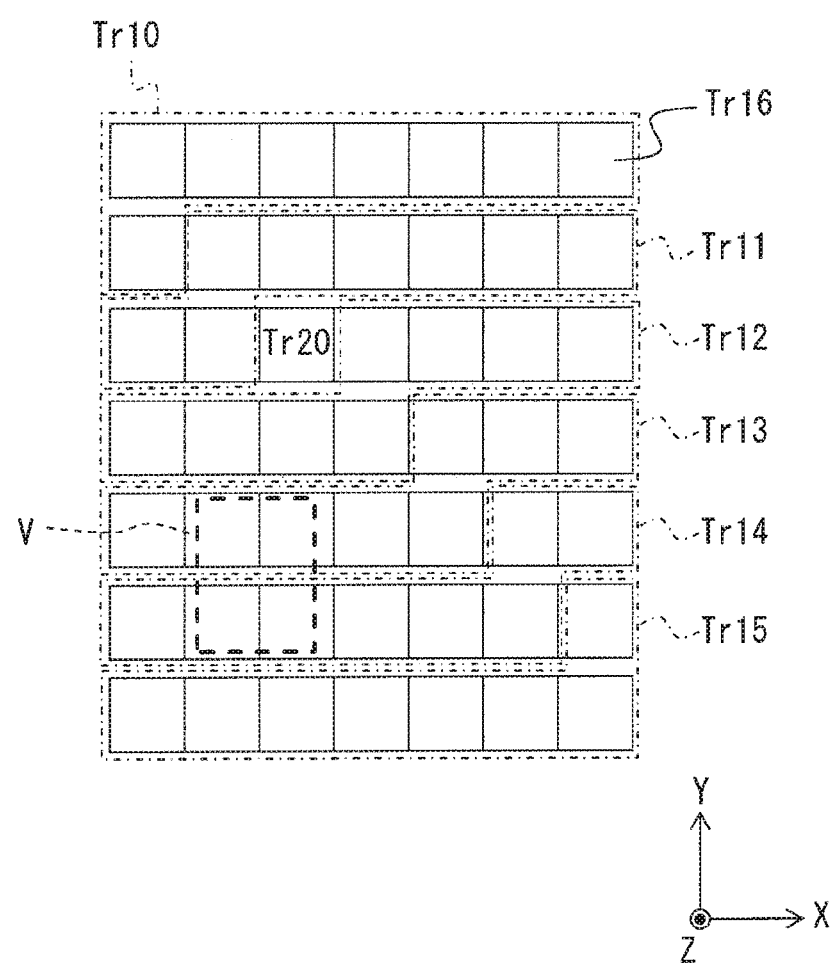
FIG. 4 is a top view illustrating the layout of NMOS transistors.

Next, the layout of the sense MOS transistor Tr20 and the main MOS transistors (Tr10 to Tr15) will be described with reference to FIGS. 4 and 5. For convenience, an X direction, a Y direction perpendicular to the X direction, and a Z direction perpendicular to an XY plane defined by the X direction and the Y direction are defined as illustrated in FIG. 4. These NMOS transistors are formed along the XY plane on a surface layer of a semiconductor substrate 300.

As illustrated in FIG. 4, the NMOS transistors constituting the main MOS transistors Tr10 to Tr15 and the sense MOS transistor Tr20 form an LDMOS (laterally diffused MOS) which includes unit MOS transistors Tr16 arranged in a 7×7 grid form along the X direction and the Y direction.

In the present embodiment, one of forty-nine unit MOS transistors Tr16 corresponds to the sense MOS transistor Tr20, and the remaining forty-eight unit MOS transistors Tr16 correspond to the main MOS transistors (Tr10 to Tr15). As illustrated in FIG. 4, each of the main MOS transistors (Tr10 to Tr15) includes eight unit MOS transistors Tr16.

The layout of these NMOS transistors will be more specifically described. FIG. 5 is an enlarged view of a region V illustrated in FIG. 4. As illustrated in FIG. 5, in each of the unit MOS transistors Tr16, a plurality of source regions S and a plurality of drain regions D are formed in a grid form. In the present embodiment, 4×4 regions form a single cell. A gate region G is formed in a manner to surround the source regions S and the drain regions D which form a single cell. Each of the unit MOS transistors Tr16 includes the gate region G, and the source regions S and the drain regions D arranged in a 4×4 grid form. The sense MOS transistor Tr20 and the main MOS transistors (Tr10 to Tr15) all include the same unit MOS transistors Tr16.

Figure 5:
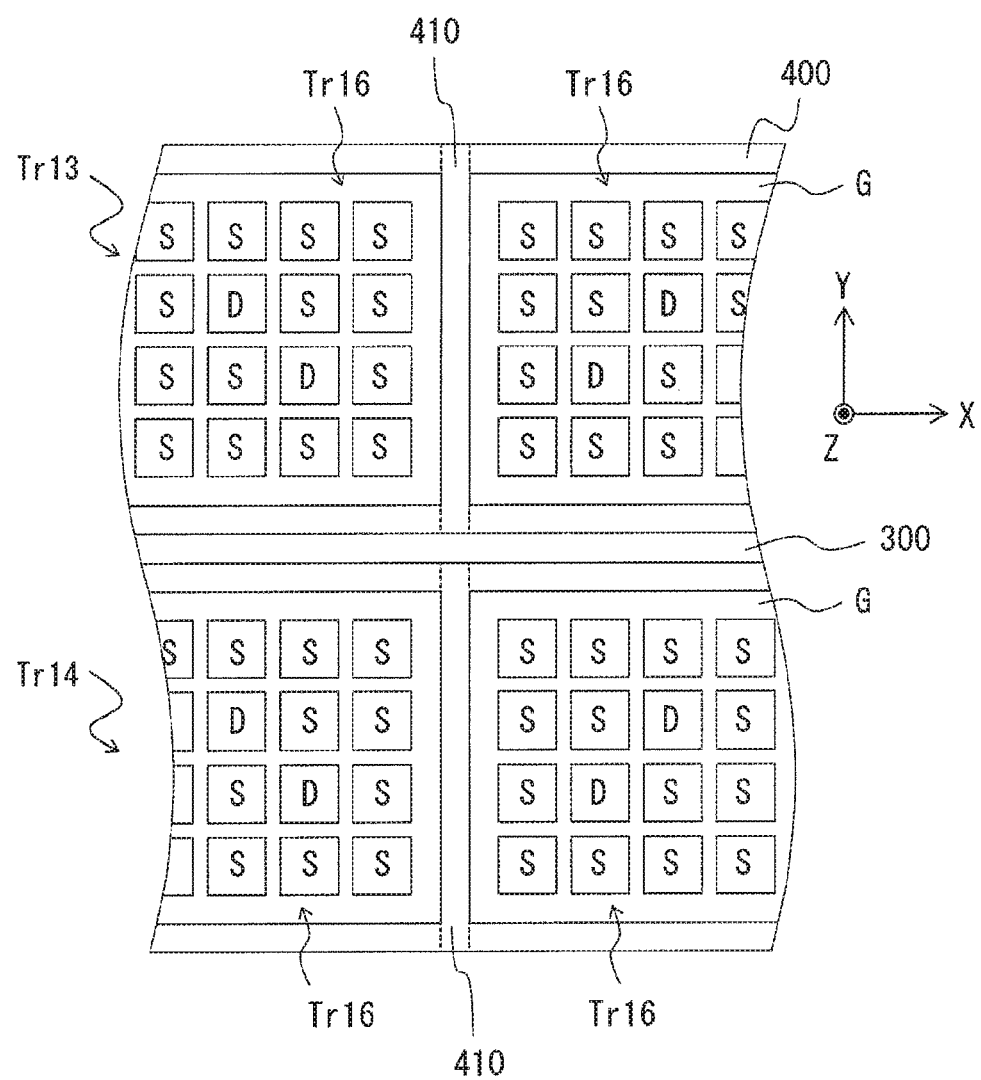
FIG. 5 is an enlarged view of a region V illustrated in FIG. 4.

As illustrated in FIG. 5, the unit MOS transistors Tr16 include a trench 400 for electrically element-isolating the unit MOS transistors Tr16 from each other. The trench 400 is formed from the surface layer of the semiconductor substrate 300 along the Z direction and surrounds each of the unit MOS transistors Tr16. In other words, the trench 400 is formed in a box shape in a manner to surround the gate region G of each of the unit MOS transistors Tr16. In the present embodiment, one side 410 of the trench 400 formed between adjacent NMOS transistors, for example, between unit MOS transistors Tr16 adjacent to each other in the X direction is shared between both the unit MOS transistors Tr16. In the present embodiment, one side of the trench 400 between unit MOS transistors Tr16 adjacent to each other in the Y direction is not shared.

As illustrated in FIG. 5, the unit MOS transistors Tr16 of the present embodiment are equalized in the shape and the area of the source region S, the shape and the area of the drain region D, and the shape and the area of the gate region G except part of the arrangement of the source regions S and the drain regions D. That is, all the unit MOS transistors Tr16 constituting the main MOS transistors (Tr10 to Tr15) and the sense MOS transistor Tr20 have the same channel length L and the same channel width W.

Next, effects of the drive device 100 according to the present embodiment will be described.

As illustrated in FIG. 1, the plurality of main MOS transistors (Tr10 to Tr15) which constitute the current mirror with the sense MOS transistor Tr20 are formed, and enabling/disabling thereof is controlled by on/off control of the switch circuit SW. Thus, the output current can be switched by switching the number of main MOS transistors (Tr10 to Tr15) to be enabled.

Further, the drain current of the sense MOS transistor Tr20 which defines the drain current of the main MOS transistor (Tr10 to Tr15) by the current mirror is defined by the reference potential Vref and the resistance value R of the reference resistor 122. Thus, the output current can be controlled with high accuracy regardless of the power supply voltage Vcc which supplies power to the drive device 100 according to the present disclosure and the current value of the output current of the off-side circuit 120. Further, the drain current of the sense MOS transistor Tr20 is constant regardless of an on/off state of the switch circuit SW. Thus, the output current can be controlled with high accuracy regardless of the number of main MOS transistors (Tr10 to Tr15) to be enabled.

The voltage application to the gate for driving the main MOS transistor (Tr10 to Tr15) as an output transistor is controlled by the output of the operational amplifier 121. Thus, it is possible to increase the switching speed compared to a case in which the control is performed with the reference current.

Further, since the drain current of the sense MOS transistor Tr20 is defined by the reference potential Vref and the resistance value R of the reference resistor 122, a drain-source voltage Vds in the sense MOS transistor Tr20 can be maintained sufficiently larger than a threshold voltage (Vth). This enables the resistance R of the reference resistor 122 to be reduced. Thus, a resistor that serves as the reference resistor 122 can be mounted together with the main MOS transistors (Tr10 to Tr15) and the sense MOS transistor Tr20 on the same semiconductor substrate 300 to achieve integration without separately preparing the resistor as a discrete part.

As illustrated in FIG. 5, the trench 400 which element-isolates the unit MOS transistors Tr16 which constitute each of the NMOS transistors (Tr20, Tr10 to Tr15) is partially shared between adjacent unit MOS transistors Tr16. In the present embodiment, one side 410 of the box-shaped trench 400 is shared between unit MOS transistors Tr16 adjacent to each other in the X direction. Thus, it is possible to reduce the layout area in the X direction compared to a configuration in which the trench 400 is not shared.

As illustrated in FIG. 5, all the unit MOS transistors Tr16 constituting the main MOS transistors (Tr10 to Tr15) and the sense MOS transistor Tr20 have the same channel length L and the same channel width W. Since all the unit MOS transistors Tr16 are equalized, it is possible to easily manufacture the drive device 100 and to make the characteristics of the drain current corresponding to the voltage applied to the gate uniform. As illustrated in FIG. 4, the unit MOS transistors Tr16 can be arranged in a grid form. Thus, it is possible to reduce the proportion of the NMOS transistors in the surface layer area of the semiconductor substrate 300. That is, the layout area can be reduced.

(First Modification)

Figure 6:
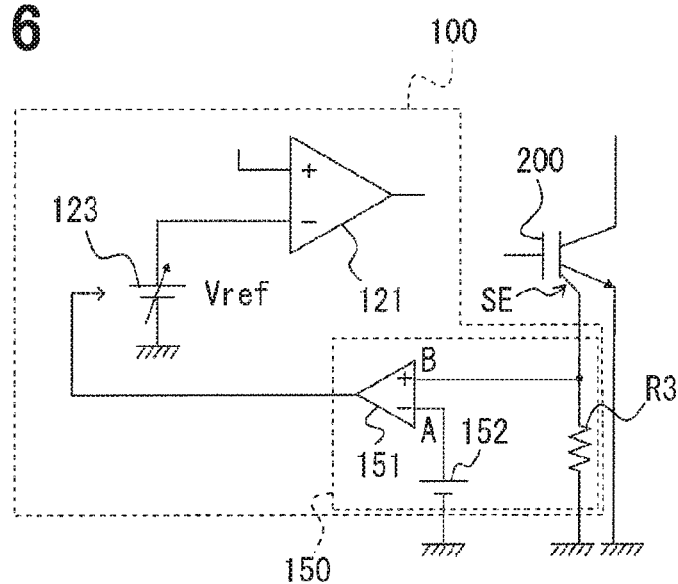
FIG. 6 is a circuit diagram illustrating a schematic configuration of a drive device according to a first modification.

In a first modification, as illustrated in FIG. 6, the drive device 100 includes a current detector 150 in addition to the configuration in the above embodiment. Further, in the reference power supply 123, the reference potential Vref is variable. In FIG. 6, the on-side circuit 110, each of the NMOS transistors (Tr10 to Tr15, Tr20), the switch circuit SW, the reference resistor 122, the dV/dt detection circuit 130, and the delay circuit 140 are omitted.

The current detector 150 detects the collector current of the IGBT 200 and protects the IGBT 200 from an overcurrent. The current detector 150 includes a comparator 151, a voltage source 152 which applies a voltage to be a threshold to one input terminal of the comparator 151, and a resistor R3 for converting the collector current of the IGBT 200 into a voltage.

As described above, the voltage source 152 is connected to one input terminal A of the comparator 151. The other input terminal B of the comparator 151 is connected to an intermediate point between a sense emitter terminal SE of the IGBT 200 and the resistor R3 which is connected between the sense emitter terminal SE and the GND. That is, a voltage corresponding to a current flowing from the sense emitter terminal SE of the IGBT 200 toward the GND and a resistance value of the resistor R3 is applied to the input terminal B of the comparator 151. The voltage applied to the input terminal B is proportional to the current flowing from the sense emitter terminal SE toward the GND. That is, this voltage increases as the collector current of the IGBT 200 increases.

When the voltage corresponding to the current flowing through the sense emitter terminal SE exceeds the voltage of the voltage source 152, that is, when the collector current exceeds a predetermined threshold, the comparator 151 controls the reference power supply 123 to increase the reference potential Vref.

Accordingly, the drain current of the sense MOS transistor Tr20 is reduced by increasing the reference potential Vref when an excessive collector current (overcurrent) flows through the IGBT 200. Thus, the drive capacity of the off-side circuit 120 is reduced, which enables the IGBT 200 to be gradually turned off. Thus, it is possible to reduce the surge voltage to protect the IGBT 200 when an overcurrent occurs.

(Second Embodiment)

Although, in the above embodiment, there has been described an example in which the control based on the temperature of the IGBT 200 is enabled in the off-side circuit 120, the control can also be applied to the on-side circuit 110.

Figure 7:
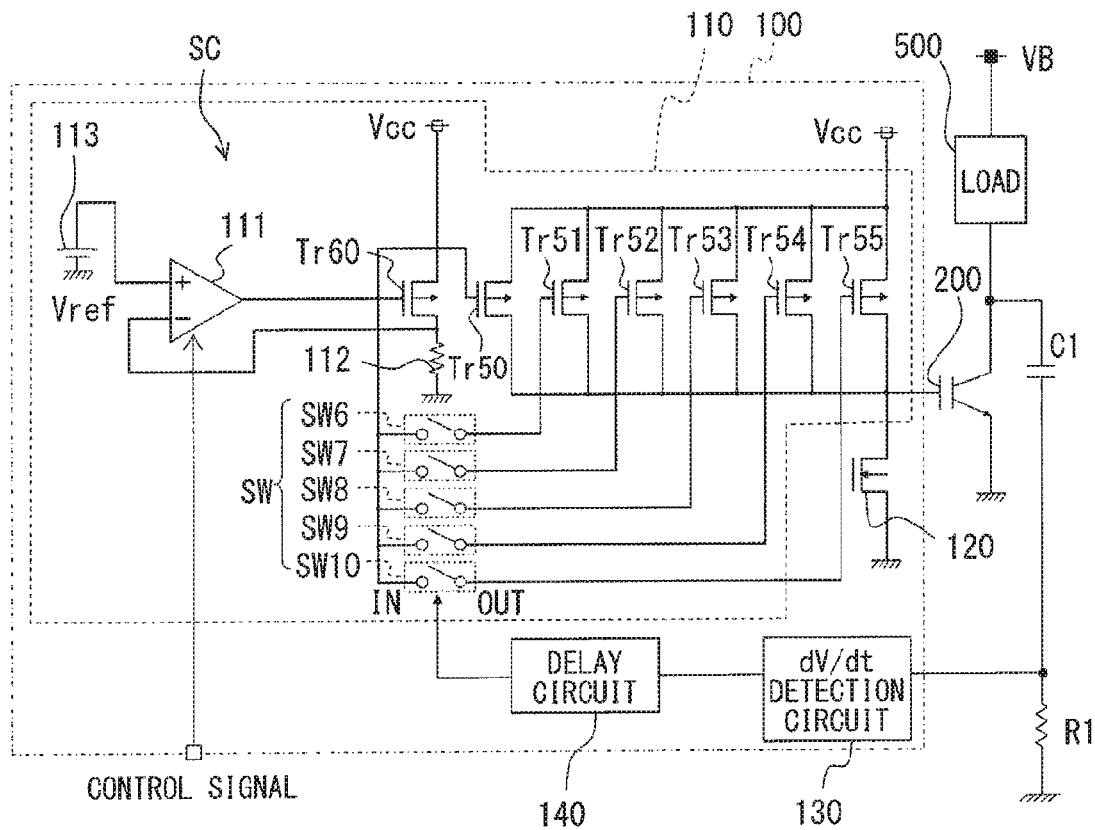
FIG. 7 is a circuit diagram illustrating a schematic configuration of a drive device according to a second embodiment.

Specifically, as illustrated in FIG. 7, the on-side circuit 110 includes a plurality of PMOS transistors (Tr50 to Tr55, Tr60). These PMOS transistors include main MOS transistors (Tr50 to Tr55) as output transistors and a sense MOS transistor Tr60 which defines drain currents of the main MOS transistors. In the present embodiment, the six main MOS transistors (Tr50 to Tr55) constitute a current mirror with respect to the sense MOS transistor Tr60. Specifically, a gale of each of the main MOS transistors (Tr50 to Tr55) is common with a gate of the sense MOS transistor Tr60, and drains thereof are connected in common to a power supply Vcc. A source of each of the main MOS transistors (Tr50 to Tr55) is connected to the gate of the IGBT 200.

The on-side circuit 110 includes an operational amplifier 111 for controlling a drain current of the sense MOS transistor Tr60, a reference resistor 112 for defining an output of the operational amplifier 111, and a reference power supply 113 which applies a reference potential Vref to one input terminal of the operational amplifier 111. When a control signal indicating turning-on of the IGBT 200 is input from a microcomputer (not illustrated), the operational amplifier 111 applies a voltage to the gate of the sense MOS transistor Tr60 so as to supply a constant current to the gate of the IGBT 200.

The on-side circuit 110 further includes switch circuits (SW6 to SW10) for switching a current value of the current supplied to the gate of the IGBT 200, that is, for switching a drive capacity. The switch circuits (SW6 to SW10) are respectively connected to the gates of the five main MOS transistors (Tr51 to Tr55) in the six main MOS transistors (Tr50 to Tr55). The switch circuits (SW6 to SW10) are equivalent to the switch circuits SW described in the first embodiment. The circuit configuration illustrated in FIG. 3 can be employed as a circuit configuration of the switch circuits (SW6 to SW10).

The main MOS transistors (Tr50 to Tr55), the sense MOS transistor Tr60, the operational amplifier 111, the reference resistor 112, the reference power supply 113, and the switch circuits (SW6 to SW10) which are constituent elements in the present embodiment are elements respectively corresponding to the main MOS transistors (Tr10 to Tr15), the sense MOS transistor Tr20, the operational amplifier 121, the reference resistor 122, the reference power supply 123, and the switch circuits (SW1 to SW5) in the first embodiment. Thus, the operation and effects of each constituent element correspond to those in the first embodiment and the modification thereof. That is, it is possible to control the output current of the on-side circuit 110 with high accuracy and to increase the switching speed compared to a case in which the control is performed with the reference current.

The reference potential Vref in the present embodiment does not necessarily require agreement with the reference potential Vref in the first embodiment.

(Third Embodiment)

The sense current control circuit SC is not limited to a circuit that includes the operational amplifier 111, 121, the reference resistor 112, 122, and the reference power supply 113, 123.

In the sense current control circuit Sc in each of the above embodiments, the feedback control is performed so as to have a current value defined by the resistance value R of the reference resistor 112, 122 and the reference potential Vref of the reference power supply 113, 123. On the other hand, a sense current control circuit Sc in the present embodiment performs no feedback control.

Figure 8:
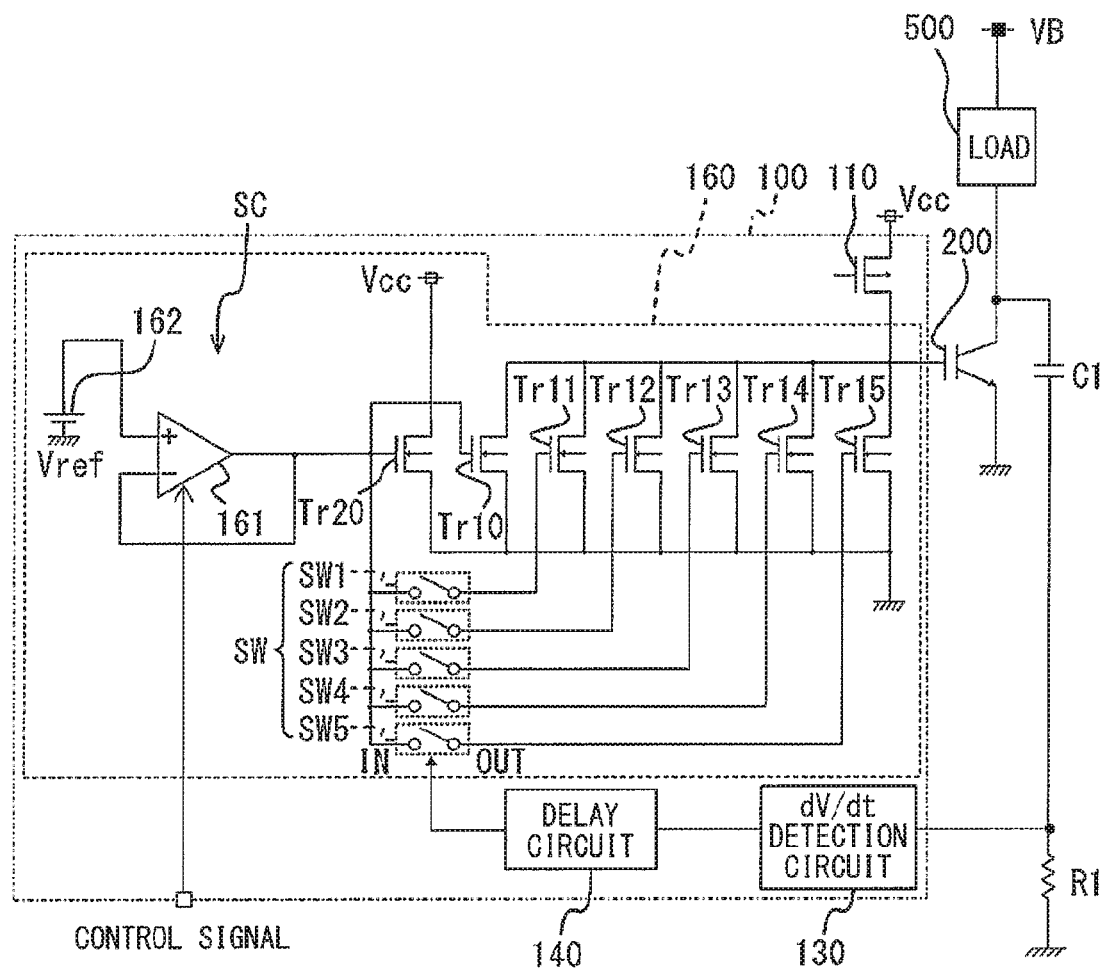
FIG. 8 is a circuit diagram illustrating a schematic configuration of a drive device according to a third embodiment.

Specifically, as illustrated in FIG. 8, the sense current control circuit SC of an off-side circuit 160 in the present embodiment includes an operational amplifier 161 which includes an output terminal connected to a gate of a sense MOS transistor Tr20 and a reference power supply 162 which applies a predetermined voltage to one input terminal of the operational amplifier 161. An output of the operational amplifier 161 is negatively fed back to the other input terminal, so that a voltage defined by the reference power supply 162 is applied to the sense MOS transistor Tr20. Also in such a configuration, the output current can be switched by switching the number of main MOS transistors (Tr10 to Tr15) to be enabled. When the sense current control circuit SC as described in the first and second embodiments is employed, it is possible to maintain the drain current of the sense MOS transistor Tr20 with a higher accuracy than the present embodiment. However, when a load 500 which requires no high accuracy is driven, it is possible to reduce the number of components and manufacturing cost by employing the sense current control circuit Sc according to the present embodiment.

(Second Modification)

Figure 9:
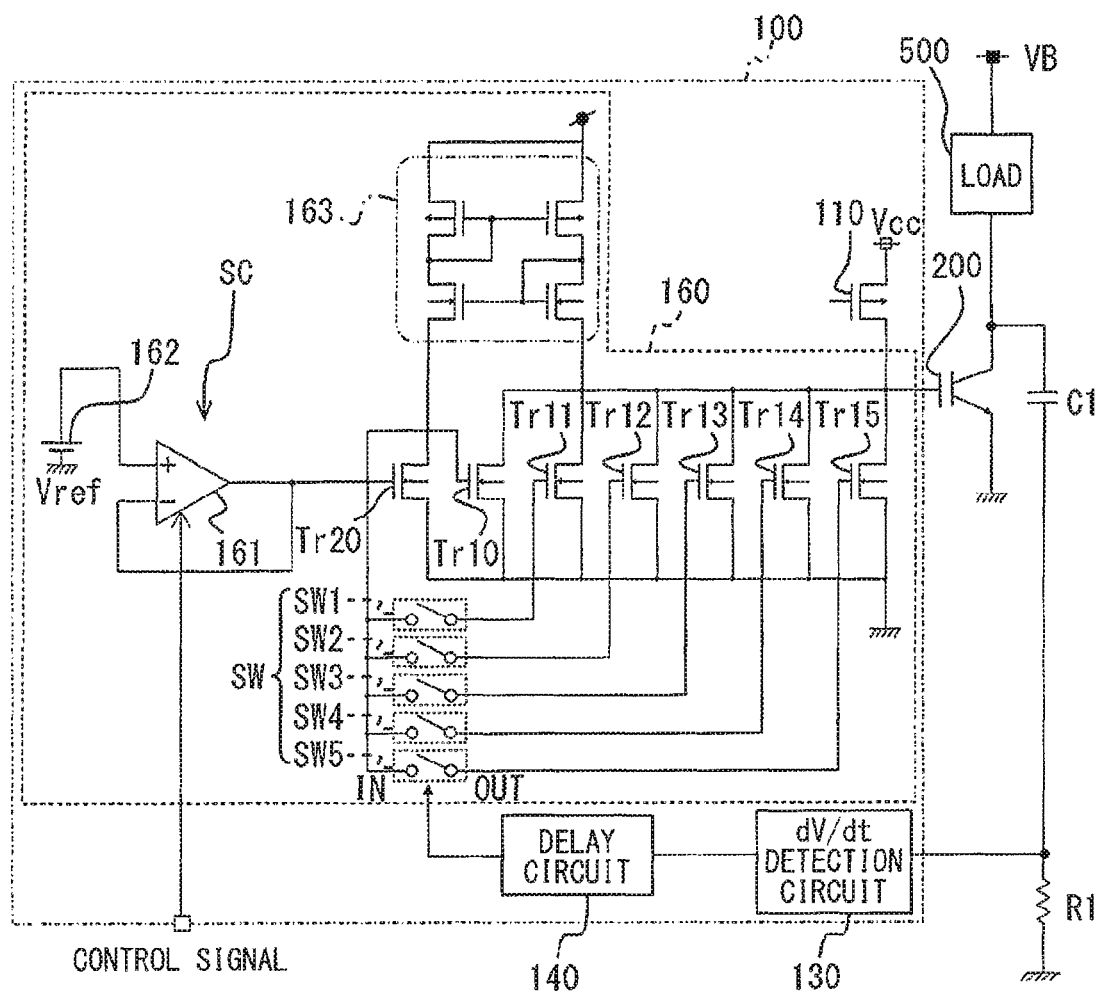
FIG. 9 is a circuit diagram illustrating a schematic configuration of a drive device according to a second modification.

As illustrated in FIG. 9, a Vds adjustment circuit 163 may be employed to highly accurately control a gate current supplied to the sense MOS transistor Tr20 and the main MOS transistors (Tr10 to Tr15) of the sense current control circuit Sc in the third embodiment.

The Vds adjustment circuit 163 in the present modification is, for example, a Wilson current mirror circuit in which two current paths are connected to the drains of the sense MOS transistor Tr20 and the main MOS transistors (Tr10 to Tr15). Accordingly, the drain-source voltage Vds in each NMOS transistor is adjusted at a constant voltage. Thus, it is possible to more accurately control the drain current of each NMOS transistor.

(Third Modification)

The threshold voltage and the mobility of charges of the sense MOS transistor Tr20 and the main MOS transistors (Tr10 to Tr15) typically have temperature characteristics. Thus, the gate voltage of the IGBT 200 may change with a change in the temperature. The present modification employs a configuration that applies an appropriate temperature characteristic to the reference power supply 162 described in the third embodiment and the second modification as a sense current control circuit SC to reduce the change of the gate voltage.

Figure 10:
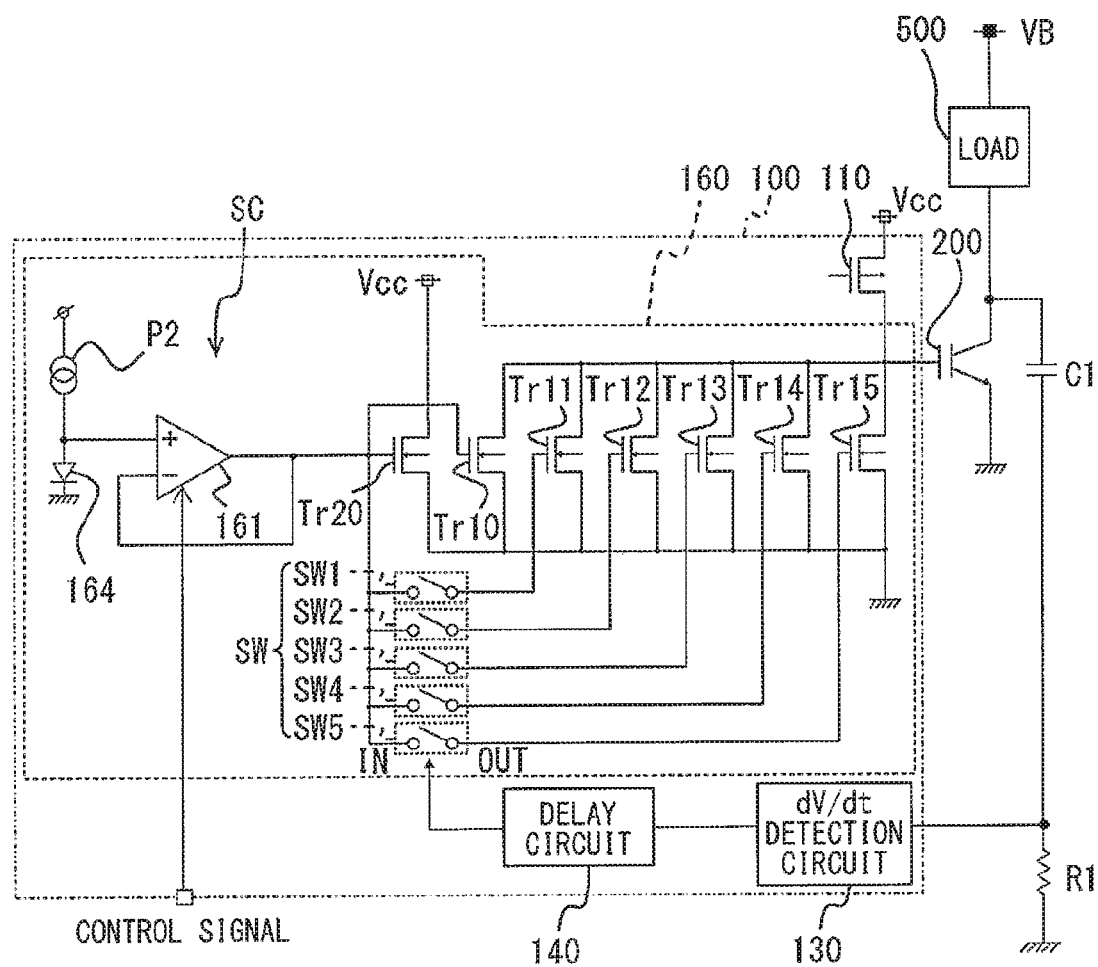
FIG. 10 is a circuit diagram illustrating a schematic configuration of a drive device according to a third modification.

Specifically, as illustrated in FIG. 10, the sense current control circuit SC of an off-side circuit 160 in the present embodiment includes an operational amplifier 161, a current source P2 which supplies a predetermined current to one input terminal of the operational amplifier 161, and a temperature sensing element 164 which is connected to the operational amplifier 161 in parallel to the current source P2. The temperature sensing element 164 in the present modification is, for example, a temperature sensing diode. The threshold voltage and the mobility of charges of each NMOS transistor typically has a negative temperature characteristic, and the voltage drop amount (Vf) of the temperature sensing diode also has a negative temperature characteristic. Thus, as illustrated in FIG. 10, the current source P2 and the temperature sensing diode are connected to a non-inversion input terminal of the operational amplifier 161, and the output of the operational amplifier 161 is negatively fed back to an inversion input terminal. Accordingly, it is possible to reduce the gate voltages of the sense MOS transistor Tr20 and the main MOS transistors (Tr10 to Tr15) along with an increase in the temperature of the drive device 100. That is, the change in the gate voltage of the IGBT 200 caused by temperature can be reduced. The temperature sensing element 164 is not limited to a temperature sensing diode.

(Other Embodiments)

Although the preferred embodiments of the present disclosure have been described above, the present disclosure is not limited at all to the above embodiments. The present disclosure can be performed with various modifications without departing from the gist of the present disclosure.

Although, in the above embodiments and modifications, the IGBT 200 has been described as an example of the power switching element, the present disclosure is not limited to this example. For example, that present disclosure can also be applied to a power MOS transistor as the power switching element.

Although the circuit configuration as illustrated in FIG. 3 has been described as an example of the switch circuit SW, the present disclosure is not limited thereto. Specifically, it is only required that the passage and interruption of a current between the input terminal IN and the output terminal OUT can be controlled on the basis of the output of the delay circuit 140.

Although, in the above embodiments and modifications, there has been described an example in which the drive device 100 includes one sense MOS transistor Tr20, a plurality of sense MOS transistor Tr20 may be formed. In this case, a plurality of main MOS transistors corresponding to each of the sense MOS transistors are formed. Further, the number of main MOS transistors is also not limited to the above example.

Although, in the above embodiments and modifications, the sense MOS transistor Tr20 includes one unit MOS transistor Tr16, the number of unit MOS transistors Tr16 is not limited to this example. Further, although, in the above embodiments and modifications, each of the main MOS transistors (Tr10 to Tr15) includes eight unit MOS transistors Tr16, the number of unit MOS transistors Tr16 is not limited to this example.

Although, in the third embodiment, the second modification, and the third modification, variations of the sense current control circuit SC with respect to the off-side circuit are described, these variations may also be applied to the on-side circuit 110.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A drive device for controlling a power switching element to turn on and off, the drive device comprising:
   an on-side circuit that performs an on operation of the power switching element; and
   an off-side circuit that performs an off operation of the power switching element, wherein:
   at least one of the on-side circuit and the off-side circuit includes:
      a plurality of main MOS transistors that provide output transistors, that are each respectively connected together in parallel at each respective drain and each respective source of the plurality of main MOS transistors, and that are electrically connected to the on-side circuit to share a common node between the on-side circuit and each respective drain or each respective source of the plurality of main MOS transistors;
      a sense MOS transistor that includes a gate in common with the main MOS transistors, constitutes a current mirror with respect to the main MOS transistors to define a drain current of each main MOS transistor; and
      a sense current control circuit that controls a drain current of the sense MOS transistor to be constant; and
   the at least one of the on-side circuit and the off-side circuit further includes a switch circuit that includes a plurality of switches that are each respectively connected to a corresponding gate of each of the main MOS transistors and that are each collectively connected to the gate of the sense MOS transistor, and controls each of the main MOS transistors to turn on and off so as to switch a gate current in the power switching element.

2. The drive device according to claim 1, wherein:
   the sense current control circuit includes:
      a reference power supply that generates a reference potential;
      a reference resistor connected in series to the sense MOS transistor; and
      an operational amplifier that generates an output at the gate of the sense MOS transistor to control a potential between the reference resistor and the sense MOS transistor to be closer to the reference potential; and
   the sense current control circuit flows a current, determined by a resistance value of the reference resistor and the reference potential, as the drain current of the sense MOS transistor.

3. The drive device according to claim 1, wherein:
   the sense current control circuit includes:
      an operational amplifier that generates an output at the gate of the sense MOS transistor;
      a current source that supplies a predetermined current to one input terminal of the operational amplifier; and
      a temperature sensing element connected to the operational amplifier; and the sense current control circuit changes the drain current of the sense MOS transistor based on a voltage drop in the temperature sensing element that depends on temperature.

4. A drive device for controlling a power switching element to turn on and off, the drive device comprising:
an on-side circuit that performs an on operation of the power switching element; and
an off-side circuit that performs an off operation of the power switching element, wherein:
at least one of the on-side circuit and the off-side circuit includes:
a plurality of main MOS transistors that provide output transistors;
a sense MOS transistor that includes a gate in common with the main MOS transistors, constitutes a current mirror with respect to the main MOS transistors to define a drain current of each main MOS transistor;
a sense current control circuit that controls a drain current of the sense MOS transistor to be constant;
a unit MOS transistor for providing each of the main MOS transistors and the sense MOS transistor has a same channel length and a same channel width; and
the at least one of the on-side circuit and the off-side circuit further includes a switch circuit that is connected to the gate of each of the main MOS transistors, and controls each of the main MOS transistors to turn on and off so as to switch a gate current in the power switching element.

5. The drive device according to claim 4, wherein:
the unit MOS transistor for providing each of the main MOS transistors and the sense MOS transistor includes an LDMOS having a trench between the sense MOS transistor and an adjacent element so as to be element-isolated from the adjacent element; and
the trench is in common with the adjacent element.

6. The drive device according to claim 1, further comprising:
a current detector that detects a collector current of the power switching element, wherein:
when the collector current of the power switching element exceeds a predetermined threshold, the current detector sets a gate voltage of the sense MOS transistor to be smaller than a gate voltage in a case where the collector current of the power switching element is equal to or less than the predetermined threshold.

7. The drive device according to claim 1, wherein
the on-side circuit and the off-side circuit are each directly connected to a gate of the power switching element.

8. The drive device according to claim 1, wherein the sense current control circuit further comprises
an operational amplifier that is configured to receive a control signal and that includes input terminals and an output terminal electrically connected to the sense MOS transistor and one or more of the plurality of MOS transistors.

9. The drive device according to claim 8, wherein
the output terminal of the operational amplifier of the sense current control circuit is electrically connected to a gate of the sense MOS transistor and a corresponding gate of one or more of the plurality of MOS transistors.

10. The drive device according to claim 8, wherein
the output terminal of the operational amplifier of the sense current control circuit is electrically connected to the switch circuit.

11. The drive device according to claim 9, wherein
the output terminal of the operational amplifier of the sense current control circuit is electrically connected to the switch circuit.

* * * * *